United States Patent
Kang et al.

(10) Patent No.: US 7,795,099 B2
(45) Date of Patent: Sep. 14, 2010

(54) SEMICONDUCTOR DEVICES HAVING FIN-TYPE ACTIVE AREAS AND METHODS OF MANUFACTURING THE SAME

(75) Inventors: Hyun-jae Kang, Gunpo-si (KR); Ji-young Lee, Yongin-si (KR); Han-ku Cho, Seongnam-si (KR); Gi-sung Yeo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 11/979,748

(22) Filed: Nov. 8, 2007

(65) Prior Publication Data

US 2008/0105931 A1    May 8, 2008

(30) Foreign Application Priority Data

Nov. 8, 2006    (KR) ............... 10-2006-0110180

(51) Int. Cl.
*H01L 21/762*    (2006.01)

(52) U.S. Cl. .................. 438/296; 257/E21.546

(58) Field of Classification Search .......... 438/296; 257/E21.546

See application file for complete search history.

(56) References Cited

U.S. PATENT DOCUMENTS

| 2005/0077553 | A1 | 4/2005 | Kim et al. |
| 2005/0250285 | A1* | 11/2005 | Yoon et al. ............. 438/283 |
| 2006/0038259 | A1* | 2/2006 | Thomas ................. 257/618 |

FOREIGN PATENT DOCUMENTS

| KR | 10-0546488 | 1/2006 |
| KR | 10-0587672 | 6/2006 |

* cited by examiner

*Primary Examiner*—W. David Coleman
*Assistant Examiner*—Daniel Shook
(74) *Attorney, Agent, or Firm*—Harness, Dickey & Pierce, P.L.C.

(57) ABSTRACT

A semiconductor device having a fin type active area includes a plurality of active regions, a first device isolation layer and a recessed second device isolation layer disposed in a direction of gate electrodes of the semiconductor device. A recessed second device isolation layer and a first device isolation layer are disposed in a vertical direction of the gate electrodes. The first device isolation layer and the plurality of active regions are alternately disposed in a first direction of the plurality of active regions.

16 Claims, 20 Drawing Sheets

SEMICONDUCTOR DEVICES HAVING FIN-TYPE ACTIVE AREAS AND METHODS OF MANUFACTURING THE SAME

PRIORITY STATEMENT

This non-provisional U.S. patent application claims priority under 35 U.S.C. §119 to Korean Patent Application No. 10-2006-0110180, filed on Nov. 8, 2006, in the Korean Intellectual Property Office, the entire contents of which is incorporated herein by reference.

BACKGROUND

Description of the Related Art

As conventional semiconductor devices become more integrated, channel length may decrease. The decreased length of a relatively short channel may cause short channel effects, formation of fine patterns and/or may limit operating speeds. For example, increasing electric fields in the vicinity of a drain region may cause punch-through in which a drain depletion region penetrates an electric potential barrier in the vicinity of a source region. In addition, thermal electrons may cause an avalanche and/or a vertical electric field may cause the mobility of a carrier to be reduced. Furthermore, short channel effects may cause an off current of a transistor to increase. Increases of off currents may degrade refresh characteristics of memory devices.

Metal-oxide semiconductor (MOS) transistors may be used to suppress short channel effects in conventional semiconductor memory devices. MOS transistors may enlarge a channel perpendicular to a substrate. The enlarged channel structure is referred to as a FinFET. The FinFET may increase a channel region, which may reduce short channel effects.

In a conventional FinFET, a plurality of active regions may be patterned to form a fin. However, in conventional methods of manufacturing a semiconductor device, forming active regions and fins using conventional exposure techniques may be relatively difficult. In addition, conventional semiconductor manufacturing processes may be relatively complicated. For example, as active regions become more dense, forming the active regions using two-dimensional patterns having an island shape may become more difficult.

SUMMARY

Example embodiments relate to semiconductor devices and methods of manufacturing the same, for example, semiconductor devices having a fin type active area and methods of manufacturing the same.

According to example embodiments, semiconductor devices may include a fin-type active area, which may be formed more easily.

At least one example embodiment provides a semiconductor device including a plurality of active regions, a first device isolation layer and a recessed second device isolation layer. The active regions, the first device isolation layer and the recessed second device isolation layer may be repeatedly disposed in a direction of gate electrodes. A recessed second device isolation layer and a first device isolation layer may be repeatedly disposed in a vertical direction of the gate electrodes. The first device isolation layer and the active regions may be alternately disposed in a long-axis direction of the active regions.

At least one other example embodiment provides a semiconductor device. According to at least this example embodiment, the semiconductor device may include a plurality of active regions, a first device isolation layer and a recessed second device isolation layer disposed in a direction of gate electrodes of the semiconductor device. A recessed second device isolation layer and a first device isolation layer may be disposed in a vertical direction of the gate electrodes. The first device isolation layer and the plurality of active regions may be alternately disposed in a first direction of the plurality of active regions.

At least one other example embodiment provides a method of manufacturing a semiconductor device having a fin type active area. According to at least this method, a first device isolation layer pattern may be formed. The first device isolation layer may have a shape in which the first device isolation layer pattern is separated from island-shaped active regions in a first direction. Trenches defining the island-shaped active regions may be formed in a second direction. Gate electrodes insulated from one another may be formed by covering exposed sidewalls of the island-shaped active regions.

At least one other example embodiment provides a method of manufacturing a semiconductor device having a fin type active area. According to at least this example embodiment, a first device isolation layer may be formed. The first device isolation layer may have a groove shape in which the first device isolation layer is separated from island-shaped active regions along a long-axis direction of the island-shaped active regions. Trenches may be formed to define the active regions in a short-axis direction of the active regions. Gate electrodes insulated from one another may be formed by covering exposed sidewalls of the active regions.

According to at least some example embodiments, a hard mask layer may be formed on a semiconductor substrate, and a first resist pattern defining a first device isolation region may be formed on the hard mask layer. The hard mask layer and the semiconductor substrate may be patterned to have a shape of the first resist pattern. A first device isolation layer may be formed on the etched hard mask layer and semiconductor substrate. The first device isolation layer may be etched to form the first device isolation layer pattern using the hard mask layer as an etching mask.

According to at least some example embodiments, the first resist pattern may have a contact shape. The hard mask layer may include a first insulating layer and a second insulating layer each having an etching selectivity. The first insulating layer and the second insulating layer may be formed of silicon nitride and silicon oxide, respectively. Alternatively, The first insulating layer and the second insulating layer may be formed of the same material such as silicon nitride or silicon oxide.

The first device isolation layer may be recessed in a space between adjacent portions of the patterned semiconductor substrate. An upper surface of the recessed first device isolation layer may be lower than an upper surface of the patterned semiconductor substrate.

According to at least some example embodiments, a hard mask layer may be formed on a semiconductor substrate. The hard mask layer may include a first insulating layer and a second insulating layer. Each of the first insulating layer and the second insulating layer may have an etching selectivity. A contact-shaped first resist pattern defining regions for forming a first device isolation pattern may be formed on the hard mask layer. The hard mask layer may be patterned to have the contact-shape of the first resist pattern. The first resist pattern and the second insulating layer may be removed, The semiconductor substrate may be patterned using the first insulating layer as an etching mask to form a plurality of grooves in the semiconductor substrate. A first device isolation layer may be formed on the patterned semiconductor substrate, and the device isolation material layer may be patterned to form the first device isolation layer pattern.

According to at least some example embodiments, a third insulating layer covering a surface of the semiconductor substrate may be formed. An upper surface of the third insulating layer may be planarized, and a line-shaped second resist pattern may be formed by covering the first device isolation layer pattern and a portion of the semiconductor substrate in which the island-shaped active regions are to be formed. Trenches may be formed by etching the semiconductor substrate using the second resist pattern as an etching mask. The third insulating layer may be formed of silicon nitride.

According to at least some example embodiments, a planarized third insulating layer and a planarized second insulating layer may be formed on a semiconductor substrate in which the first device isolation layer pattern is formed. Each of the planarized third insulating layer and the planarized second insulating layer may have an etching selectivity. A line-shaped resist pattern may be formed on the planarized second insulating layer. The planarized second insulating layer and the planarized third insulating layer may be etched using the line-shaped resist pattern as an etching mask. The line-shaped resist pattern and the planarized second insulating layer may be removed, and trenches may be formed by etching the semiconductor substrate using the planarized third insulating layer as an etching mask.

According to at least some example embodiments, the trenches may be filled with a fourth insulating layer. The fourth insulating layer may be recessed, and a gate electrode material layer covering a surface of the semiconductor substrate may be formed. A fourth resist pattern defining the gate electrodes may be formed on the gate electrode material layer, and the gate electrodes may be formed by removing the gate electrode material layer using the fourth resist pattern as an etching mask.

According to at least some example embodiments, an upper surface of the fourth insulating layer may be planarized to have a height equal to a height of an upper surface of the third insulating layer. A hard mask layer may be formed on the planarized fourth insulating layer and the third insulating layer, and a third resist pattern for recessing the fourth insulating layer may be formed on the hard mask layer. A portion of the fourth insulating layer may be removed using the third resist pattern and the third insulating layer as an etching mask. The third insulating layer may be removed after recessing the fourth insulating layer.

According to at least some example embodiments, the first device isolation layer may have a stack structure including a silicon oxide layer and a silicon nitride layer. An upper surface of the first device isolation layer may be lower than an upper surface of the active regions. Depths at which the first device isolation layer and the second device isolation layer are formed in the substrate may be different.

BRIEF DESCRIPTION OF THE DRAWINGS

Example embodiments will become more apparent by describing in detail the attached drawings in which:

FIGS. 1A through 10A are plan views illustrating a method of manufacturing a semiconductor device according to an example embodiment;

FIGS. 1B through 10B are cross-sectional views taken along lines IB-XB, respectively, (direction of gate electrodes) of FIGS. 1A through 10A;

FIGS. 1C through 10C are cross-sectional views taken along lines IC-XC (direction of gate electrodes) of FIGS. 1A through 10A; and FIGS. 1D through 10D are cross-sectional views taken along lines ID-XD (long-axis direction of active regions) of FIGS. 1A through 10A.

DETAILED DESCRIPTION OF EXAMPLE EMBODIMENTS

Figure 1A:
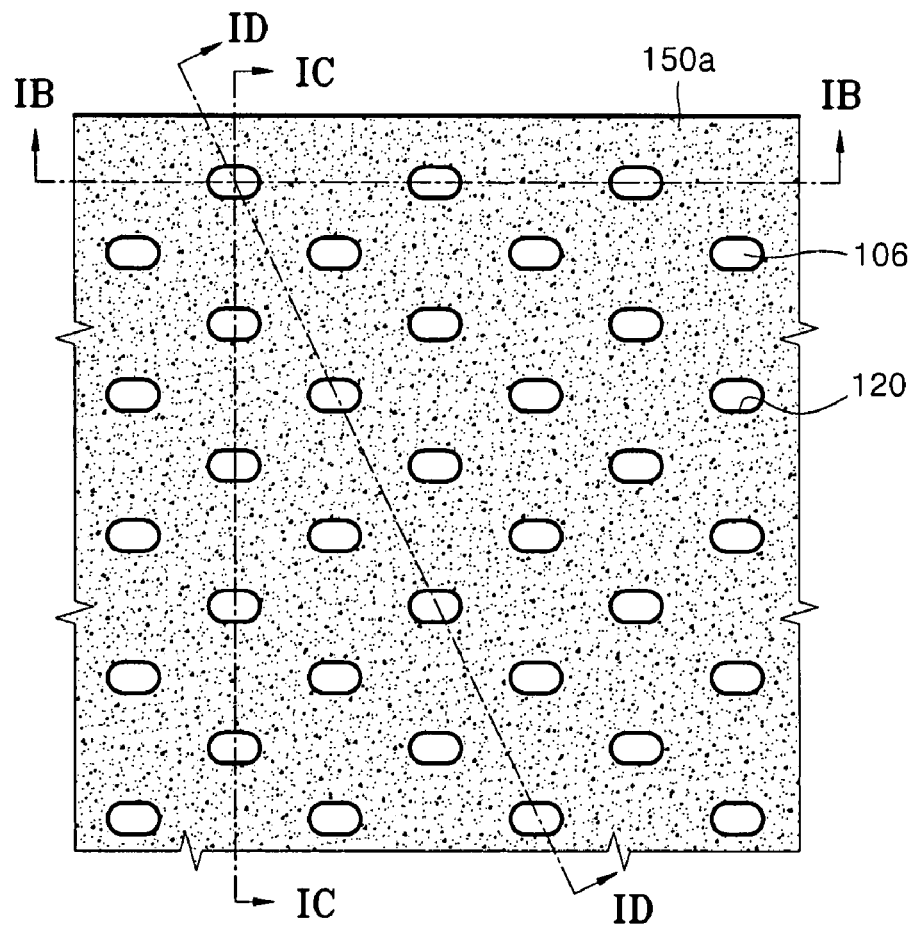

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

At least one example embodiment will represent a method of forming active regions using a line and space pattern (hereinafter, referred to as a line pattern). Example embodiments will be described with regard to device-isolating a long-axis direction of the active regions, forming the active regions and forming gate electrodes.

FIGS. 1A through 10A are plan views, FIGS. 1B through 10B are cross-sectional views taken along lines IB-XB, respectively, (direction of gate electrodes) of FIGS. 1A through 10A, FIGS. 1C through 10C are cross-sectional views taken along lines IC-XC (direction of gate electrodes) of FIGS. 1A through 10A, and FIGS. 1D through 10D are cross-sectional views taken along lines ID-XD (long-axis direction of active regions) of FIGS. 1A through 10A.

Collectively, FIGS. 1A through 10D illustrate a method of manufacturing a semiconductor device (e.g., a FinFET) according to an example embodiment.

Figure 1B:
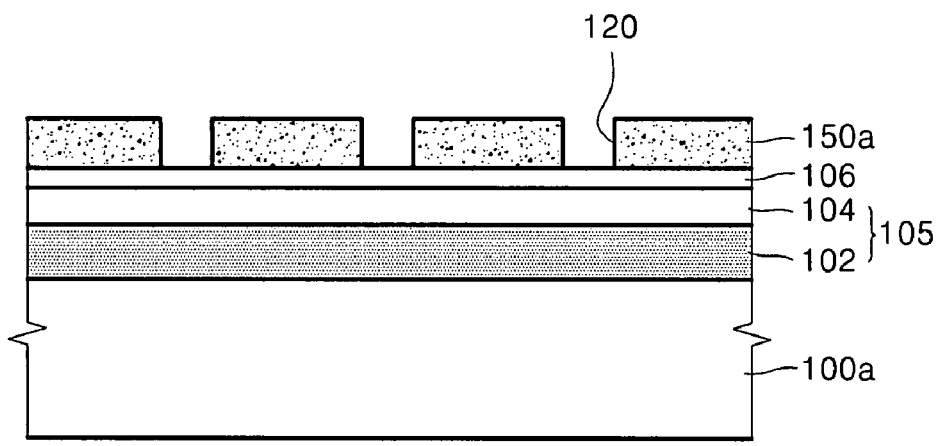
Figure 1C:
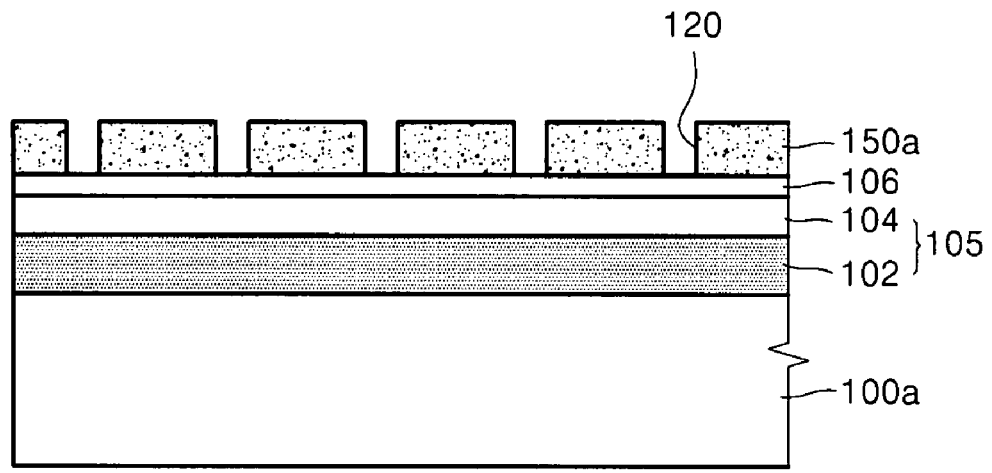
Figure 1D:
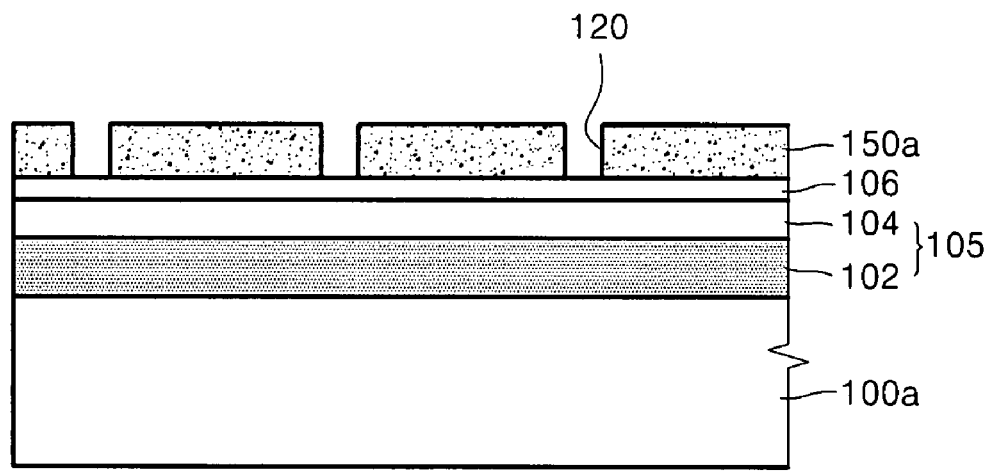

As noted above, FIG. 1A illustrates a plan view of a method of manufacturing a semiconductor device according to an example embodiment. FIGS. 1B through 1D are cross-section views taken along lines IB, IC and ID, respectively.

FIGS. 1A through 1D illustrate a method of forming a first resist pattern 150a for forming a first device isolation and a FinFET. In this example embodiment, a hard mask layer 105 may be formed on a semiconductor substrate 100a, for example, a silicon substrate. The hard mask layer 105 may include a first insulating layer 102 and a second insulating layer 104 each having an etching selectivity. The hard mask layer 105 may be deposited using, for example, chemical vapor deposition (CVD), sub-atmospheric CVD (SACVD), low pressure CVD (LPCVD), plasma enhanced CVD (PECVD) or the like. An anti-reflection layer 106 may be coated on the hard mask layer 105 and a first resist pattern 150a may be formed. The first resist pattern 150a may have a contact shape for forming a first device isolation layer. The first resist pattern 150a may include grooves 120 separating the first device isolation layer from island-shaped active regions (130 of FIG. 5D) by a distance along a long-axis direction of the island-shaped active regions (130 of FIG. 5D).

The contact-shaped first resist pattern 150a may have a structure that is relatively stable for etching a lower layer. For example, the contact-shaped first resist pattern 150a may have a structure that is less likely to deform during an etching process than an island-shaped or line-shaped pattern.

In this example, the first insulating layer 102 may be a silicon nitride layer or the like and the second insulating layer 104 may be a silicon oxide layer or the like. The first resist pattern 150a according to example embodiments may isolate (e.g., perform device isolation on the active regions 130 in a long-axis direction. This has a characteristic of a preparation process of forming active regions (130 of FIG. 4A) using a second resist pattern 150b. The second resist pattern 150b may be a line pattern. In this example, device isolation in a long-axis direction of the active regions is referred to as a first device isolation or first device isolation pattern.

Figure 2A:
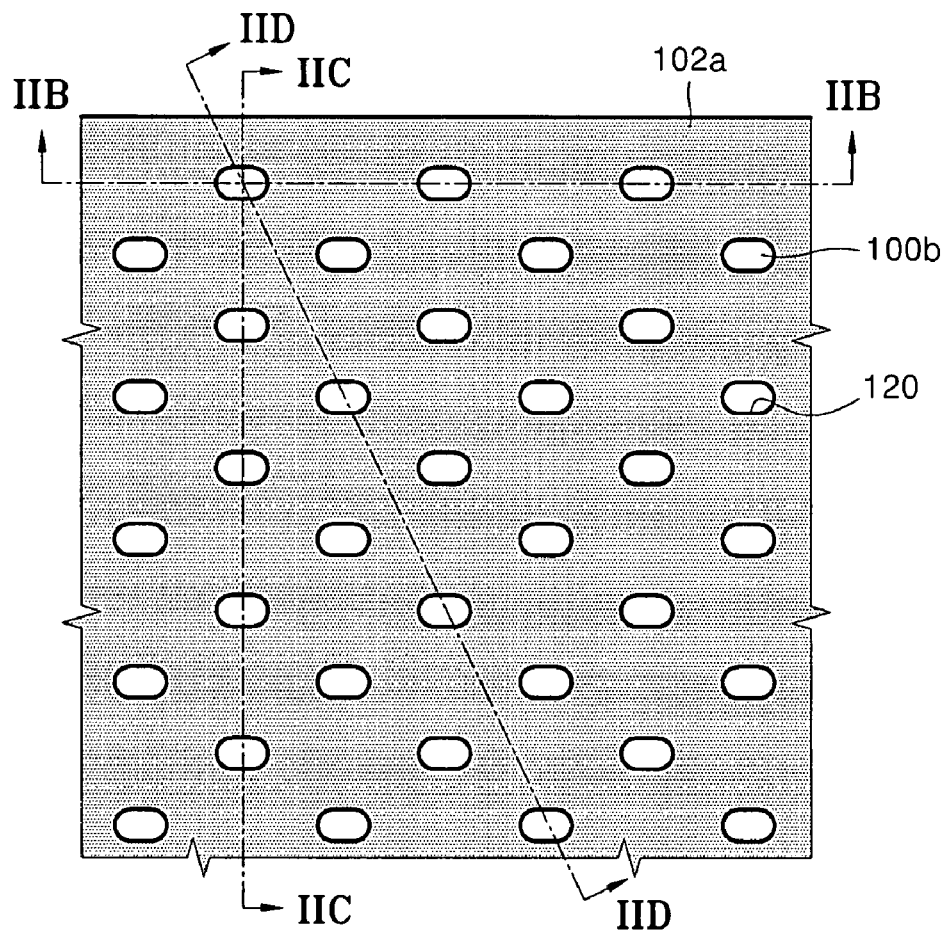
Figure 2B:
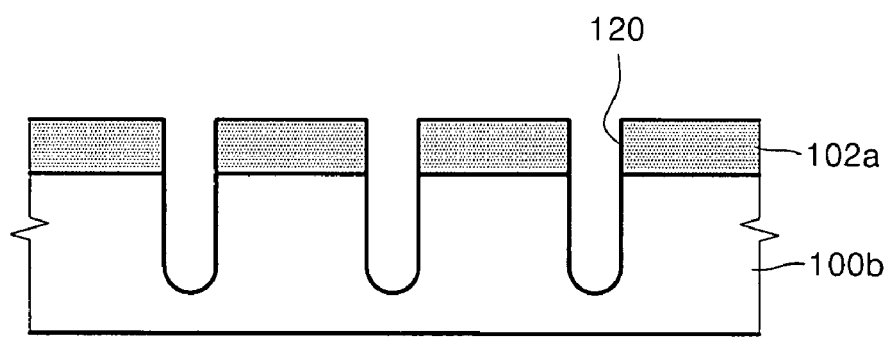
Figure 2C:
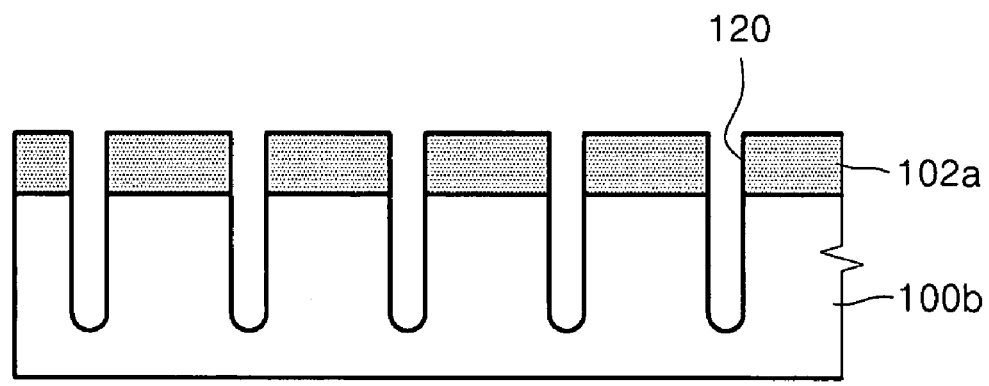
Figure 2D:
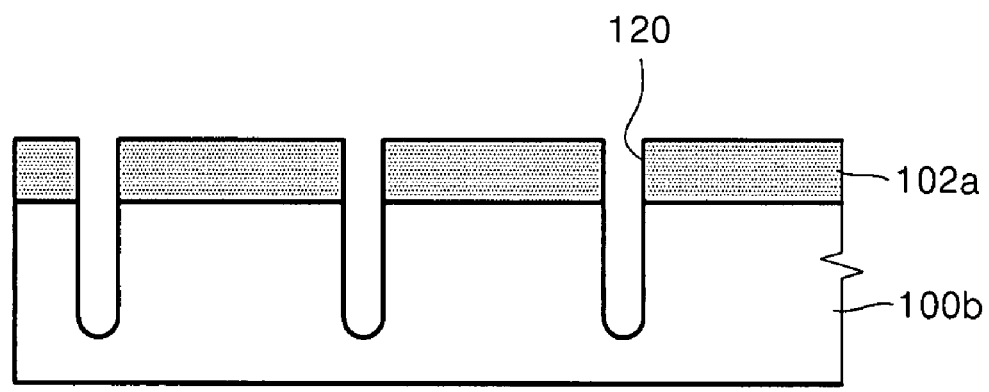

As noted above, FIG. 2A illustrates a plan view, and FIGS. 2B through 2D are cross-section views taken along lines IIB, IIC and IID, respectively.

Referring to FIGS. 2A through 2D, a semiconductor substrate 100a may be etched so that each of a plurality of grooves 120 extend into the semiconductor substrate 100b forming a first device isolation and FinFET. For example, the semiconductor substrate 100a may be etched to a depth sufficient for device isolation using an etching method such as dry etching or the like. As desired, an anti-reflection layer 106 and a hard mask layer 105 may be etched using the first resist pattern 150a. The first resist pattern 150a, the anti-reflection layer 106 and the second insulating layer 104 may be removed. The grooves 120 may be formed in the semiconductor substrate 100b using a patterned first insulating layer 102a as an etching mask to reduce etching depth.

The first resist pattern 150a and the second insulating layer 104 may be removed. Thus, a first insulating layer 102a may be patterned such that grooves 120 may extend through the first insulating layer 102a into the semiconductor substrate 100b. The patterned first insulating layer 102a may be used as an etch stop layer when forming a recessed first device isolation layer (110 of FIG. 3A) as will be described in more detail below.

Figure 3A:
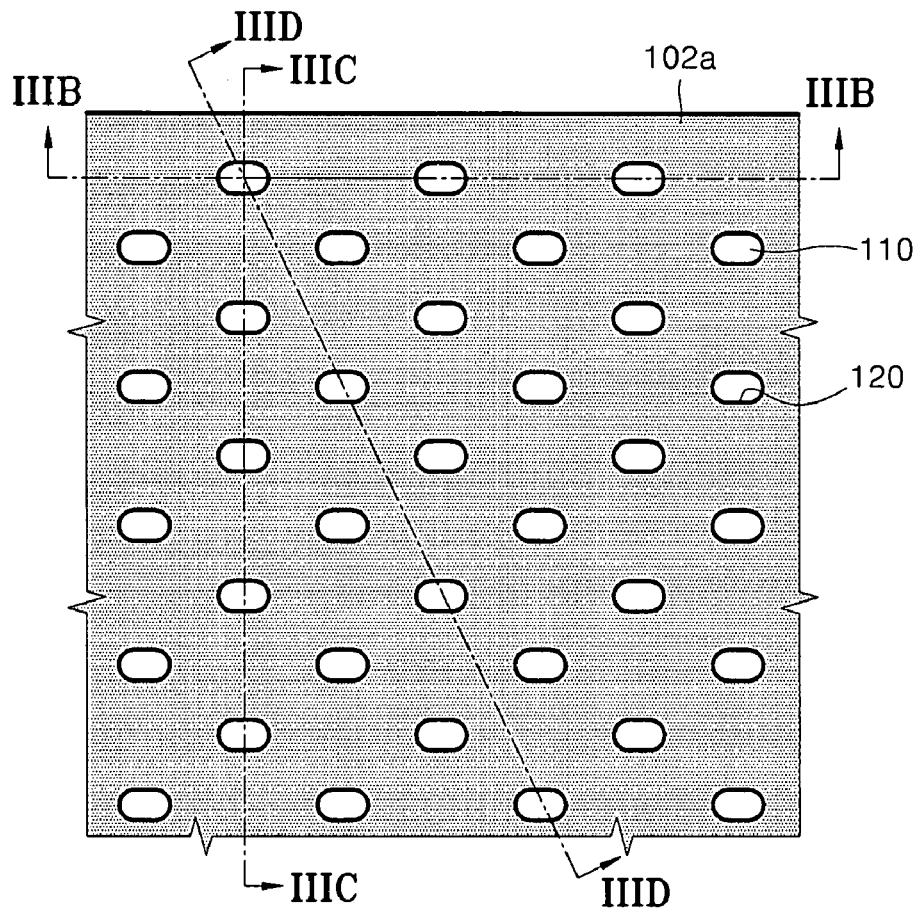
Figure 3B:
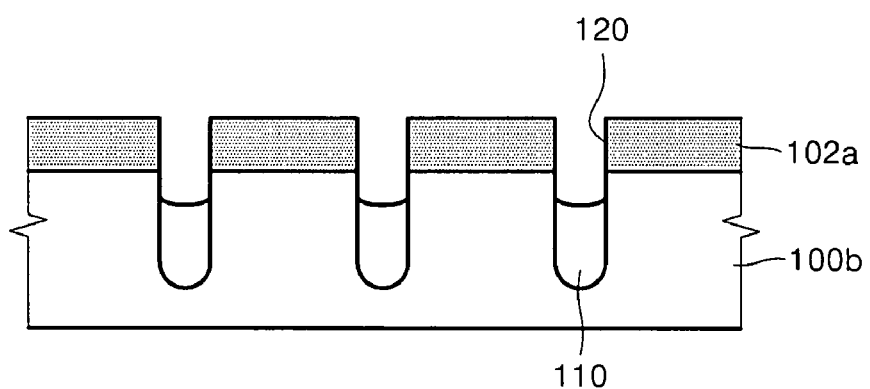
Figure 3C:
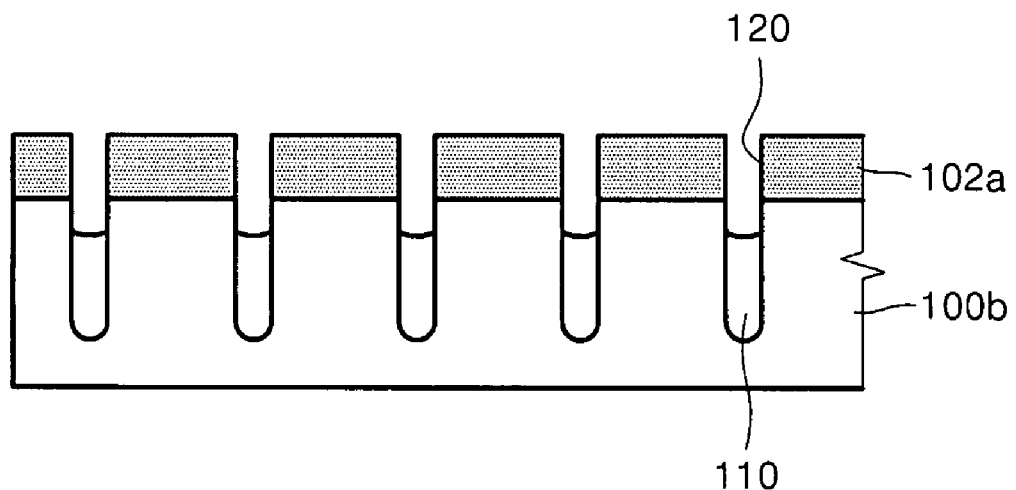
Figure 3D:
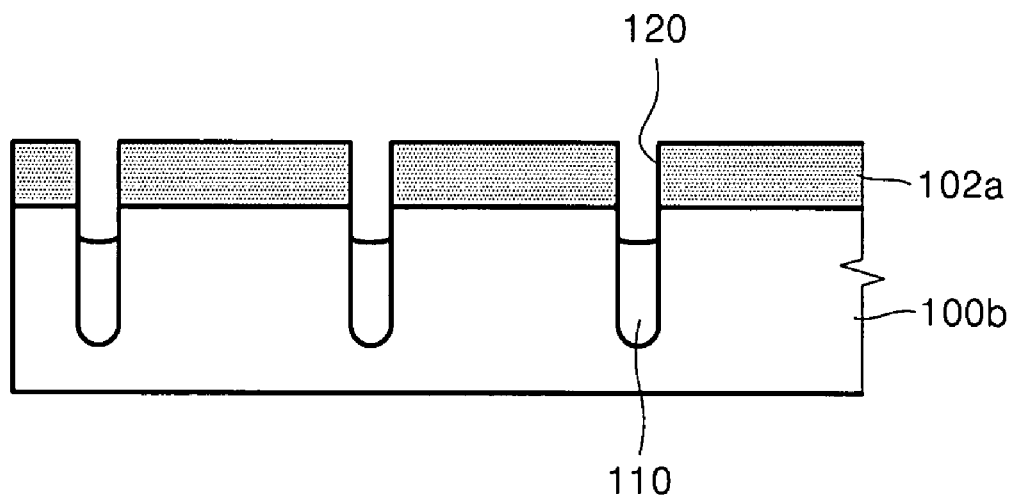

FIGS. 3A through 3D illustrate a method of forming a recessed first device isolation layer 110. As noted above, FIG. 3A illustrates a plan view, and FIGS. 3B through 3D are cross-section views taken along lines IIIB, IIIC and IIID, respectively.

Referring to FIGS. 3A through 3D, a device isolation material layer for forming the first device isolation layer (not shown) may be coated on the entire surface of the first insulating layer 102a to fill the grooves 120. The device isolation material layer coating the surface of the first insulating layer 102a may be removed using wet etching. As a result, the device isolation material layer filling the grooves 120 may be recessed in the grooves 120 forming a recessed first device isolation layer 110. When removing the device isolation material layer, the first insulating layer 102a may be used as an etching mask. An upper surface of the recessed first device isolation layer 110 may be lower than the upper surface of the semiconductor substrate 100b. The upper surface of the device isolation layer 110 may have an upward concave shape.

FIGS. 1A through 3D illustrate a method of performing device isolation along a long-axis (also referred to herein as "first") direction of active regions before defining the active regions. The long-axis direction of the active regions may be perpendicular or substantially perpendicular to a direction of gate electrodes or may be formed at a given or desired angle. An example method of forming active regions according to an example embodiment will now be described.

Figure 4A:
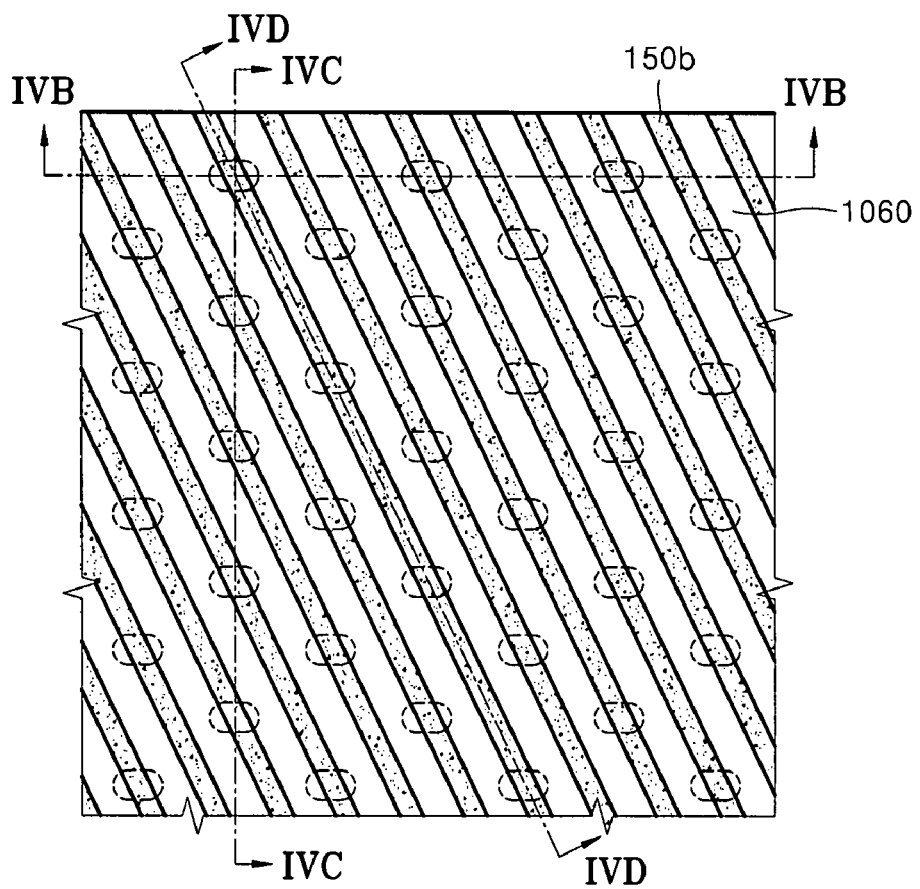
Figure 4B:
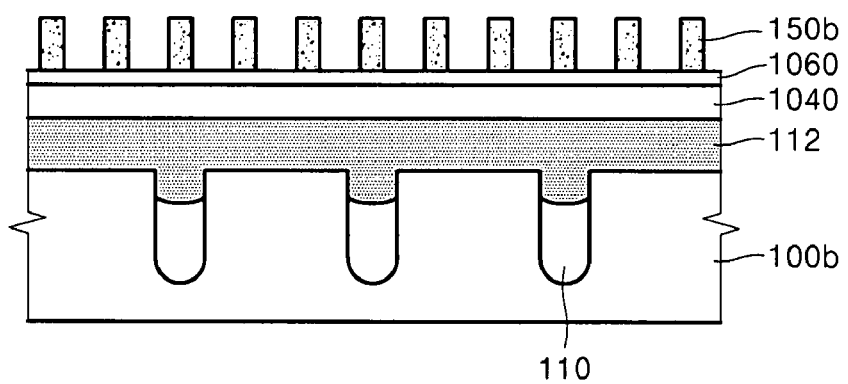
Figure 4C:
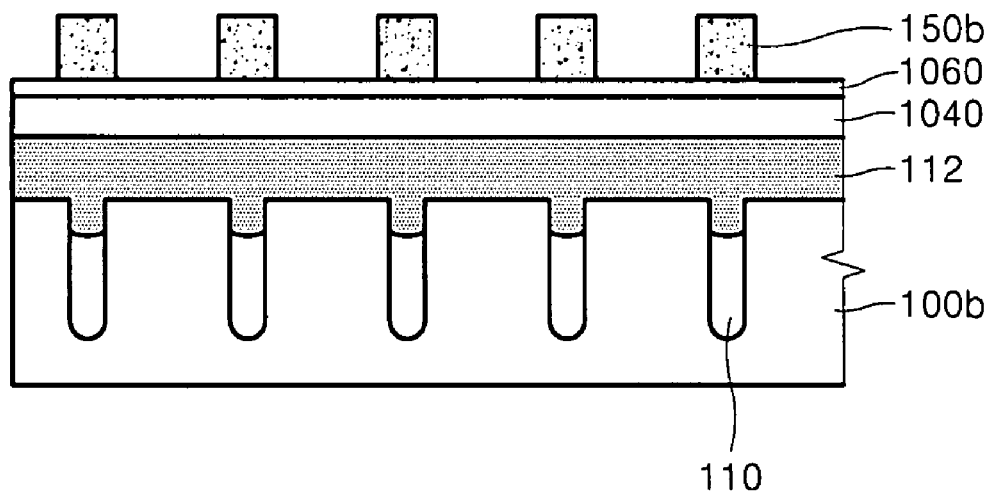
Figure 4D:
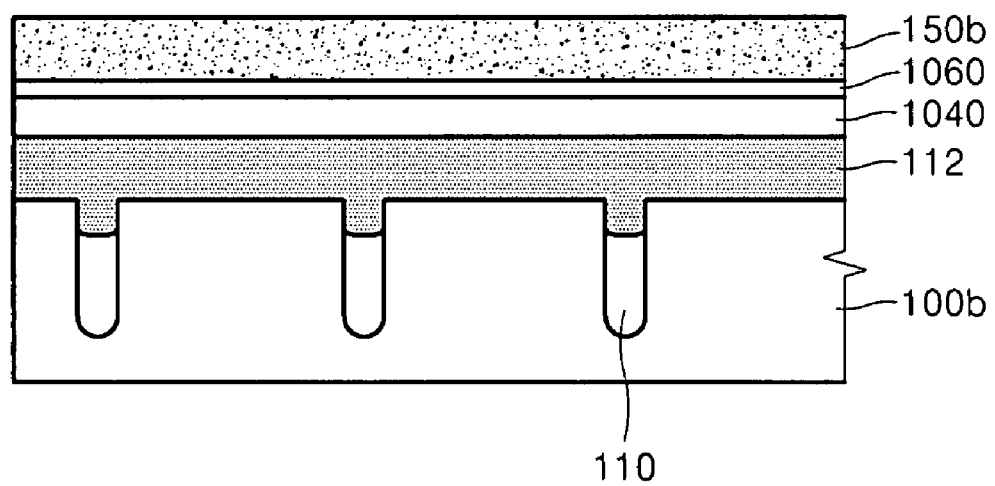

FIGS. 4A through 4D illustrate a method of forming a second resist pattern 150b for defining the active regions. As noted above, FIG. 4A illustrates a plan view, and FIGS. 4B through 4D are cross-section views taken along lines IVB, IVC and IVD, respectively.

Referring to FIGS. 4A through 4D, the entire surface of the semiconductor substrate 100b may be covered by a third insulating layer 112. The third insulating layer 112 may also fill the grooves 120 (e.g., as shown in FIGS. 3A and 3B) in which the first device isolation layer 110 is formed. An upper surface of the third insulating layer 112 may be planarized using a planarization process. A second insulating layer 104 and an anti-reflection layer 106 may be stacked on the planarized third insulating layer 112. The third insulating layer 112 may be a silicon nitride layer or the like.

Figure 5A:
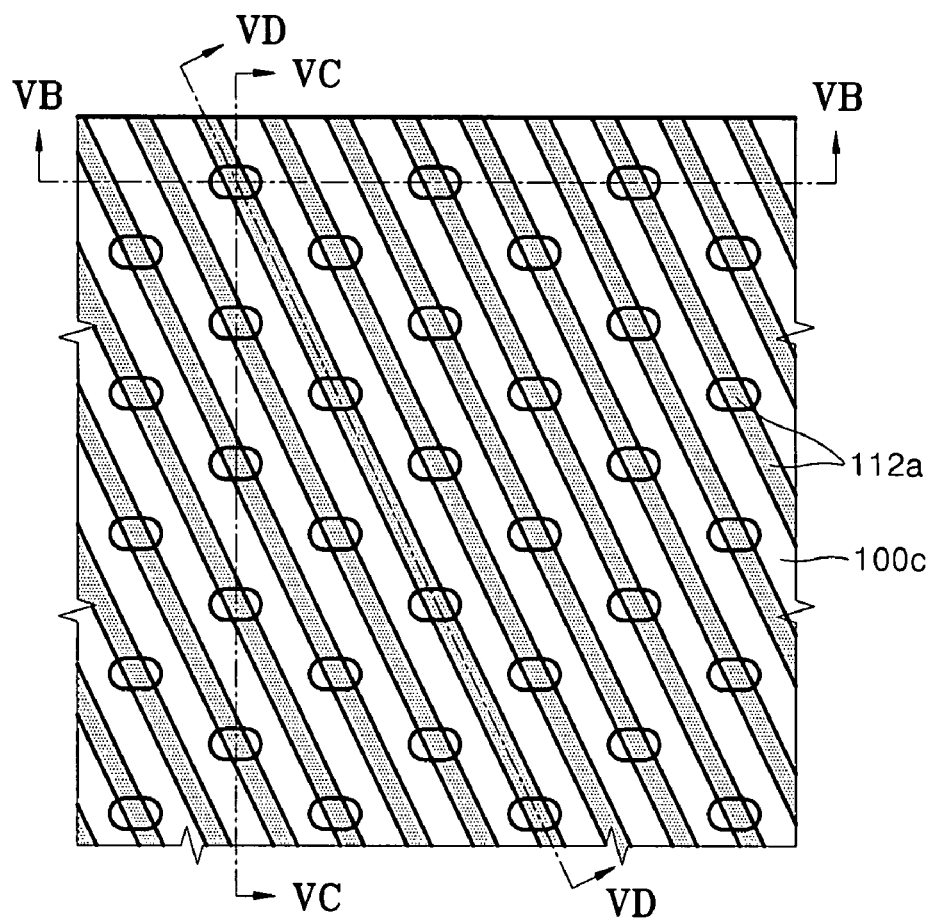

The second resist pattern 150b may be a line pattern extending in a long-axis direction of the first device isolation layer 110 and the active regions 130 (e.g., as shown in FIG. 5A). As well known, the active regions may be formed more easily using the line pattern than an island-shaped pattern. For example, because the line pattern is straight line shaped, the line pattern may be more easily patterned using off-axis illumination and a design rule may be reduced or substantially reduced using double patterning.

Figure 5B:
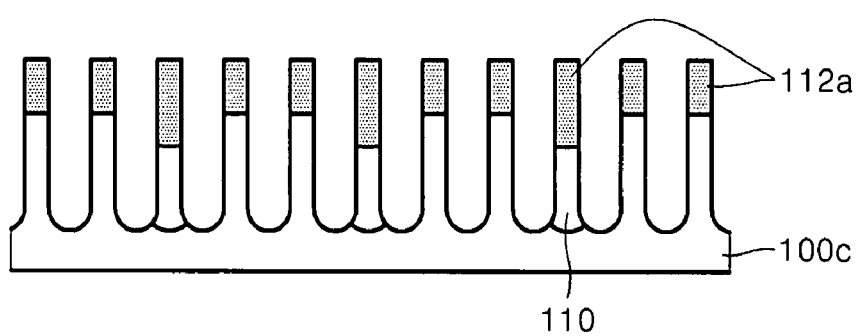
Figure 5C:
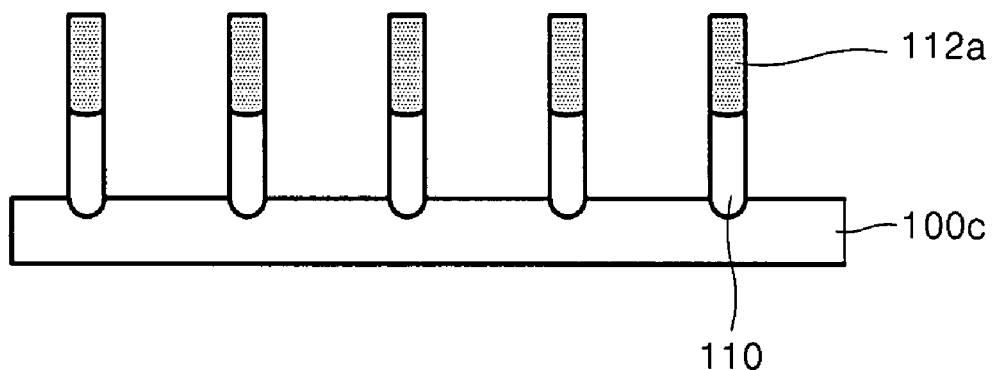
Figure 5D:
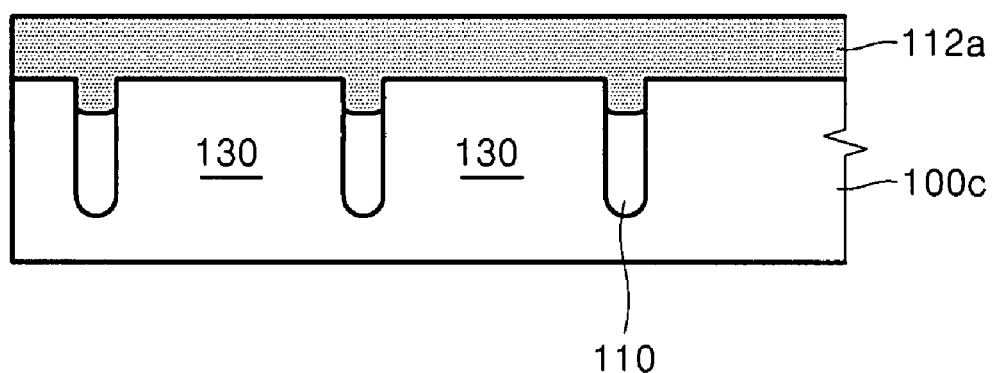

FIGS. 5A through 5D illustrate a method of forming a plurality of active regions 130. As noted above, FIG. 5A illustrates a plan view, and FIGS. 5B through 5D are cross-section views taken along lines VB, VC and VD, respectively.

Referring to FIGS. 5A through 5D, a semiconductor substrate 100c may be etched by perforating the anti-reflection layer 1060, the second insulating layer 1040 and the third insulating layer 112a using the second resist pattern 150b as an etching mask. As a result, fin-shaped active regions 130 may be formed on the semiconductor substrate 100c. The second resist pattern 150b, the anti-reflection layer 1060 and the second insulating layer 1040 may be removed after etching. A trench may be formed in the semiconductor substrate 100b using the patterned third insulating layer 112a as an etching mask. This may reduce an etching depth in an etching process.

As illustrated in FIGS. 5A through 5D, a plurality of active regions 130 (e.g., two active regions in FIG. 5) may be disposed in a direction of gate electrodes (e.g., diagonal direction). A portion etched in a trench shape and a first device isolation layer 110 may be repeatedly disposed in a vertical direction of the gate electrodes. The first device isolation layer 110 and the active regions 130 may be alternately disposed in a long-axis direction of the active regions 130.

The active regions 130 according to example embodiments may be formed simultaneously or concurrently with device isolation. For example, the trench may be formed by the second resist pattern 150b so that the active regions 130 may be insulated from adjacent active regions. Device isolation may be implemented by filling the trench. A method of simultaneously or concurrently forming the active regions 130 and the trench may simplify processes as compared to the conventional art.

Figure 6A:
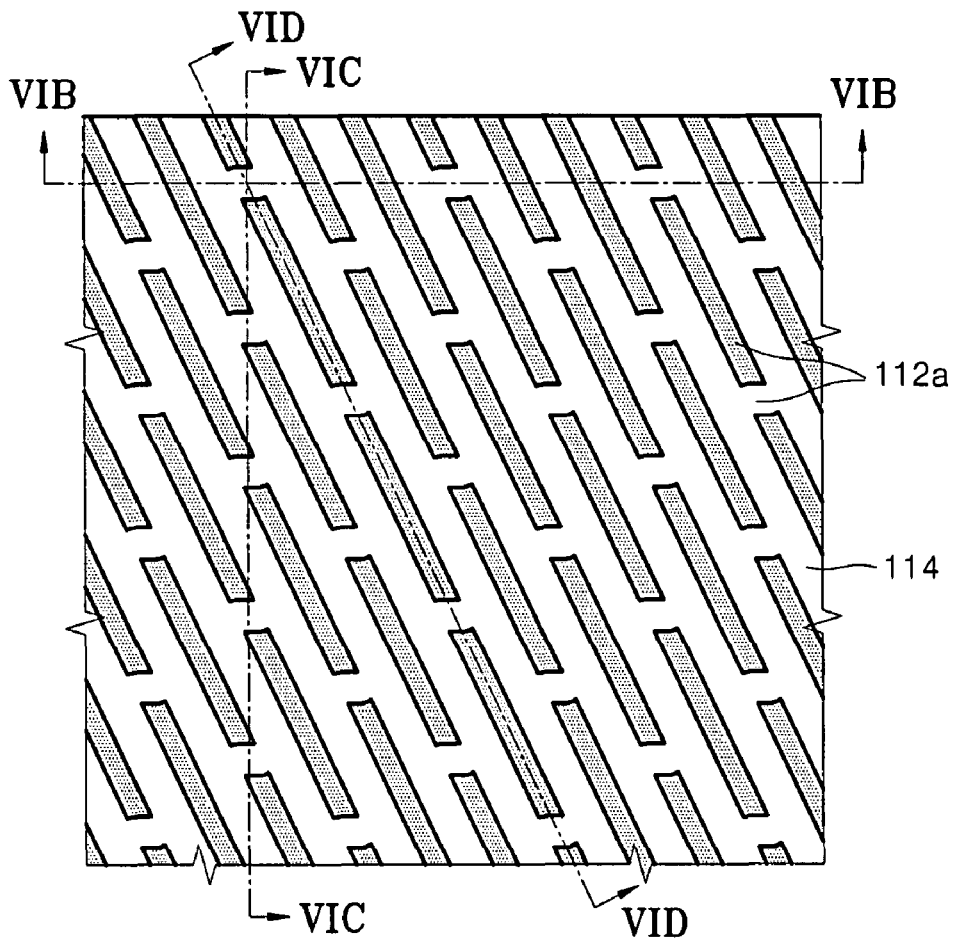
Figure 6B:
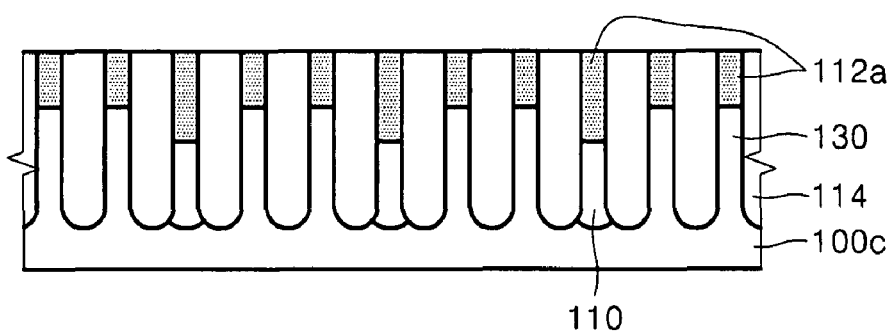
Figure 6C:
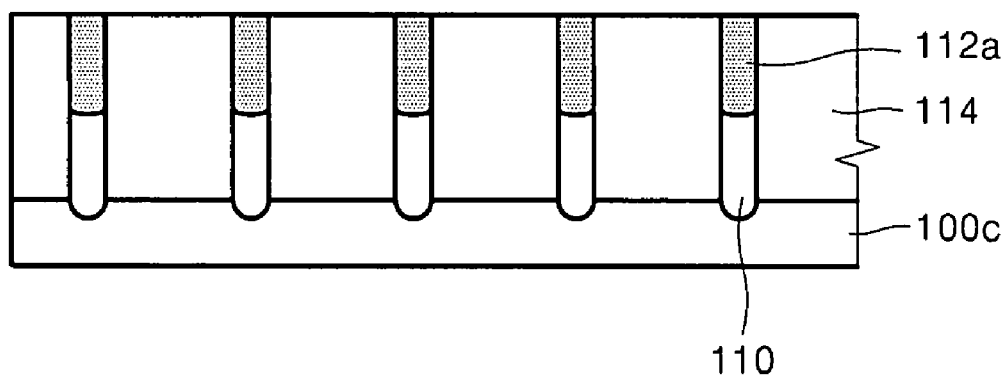
Figure 6D:
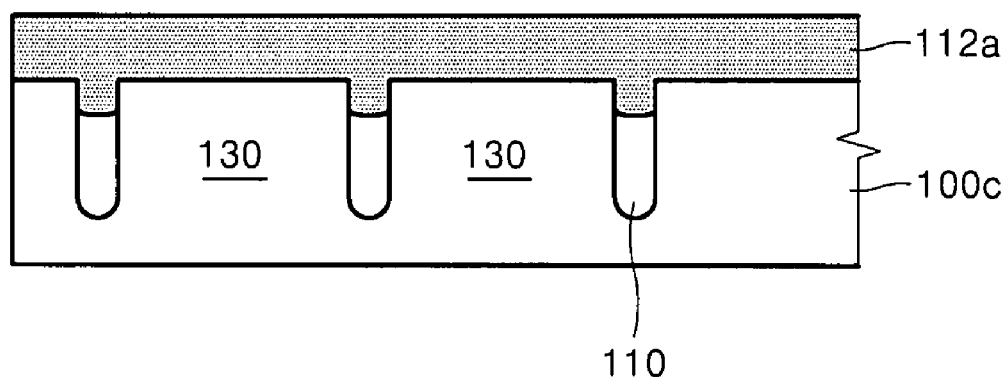

Referring to FIGS. 6A through 6D, as noted above, FIG. 6A illustrates a plan view, and FIGS. 6B through 6D are cross-section views taken along lines VIB, VIC and VID, respectively.

In FIGS. 6A through 6D, the second device isolation layer 114 may be formed by gap-filling a device isolation material layer in the trench. For example, the device isolation material layer (e.g., a silicon oxide layer) may be filled in the trench and planarized so that the second device isolation layer 114 may be separated from the active regions 130. The third insulating layer 112a positioned on the first device isolation layer 110 may function as a planarization suppression (e.g., prevention) layer. As a result, the active regions 130 may be device-isolated by the first device isolation layer 110 in a long-axis direction and by the second device isolation layer 114 in a short-axis (also referred to herein as the "second") direction.

Figure 7A:
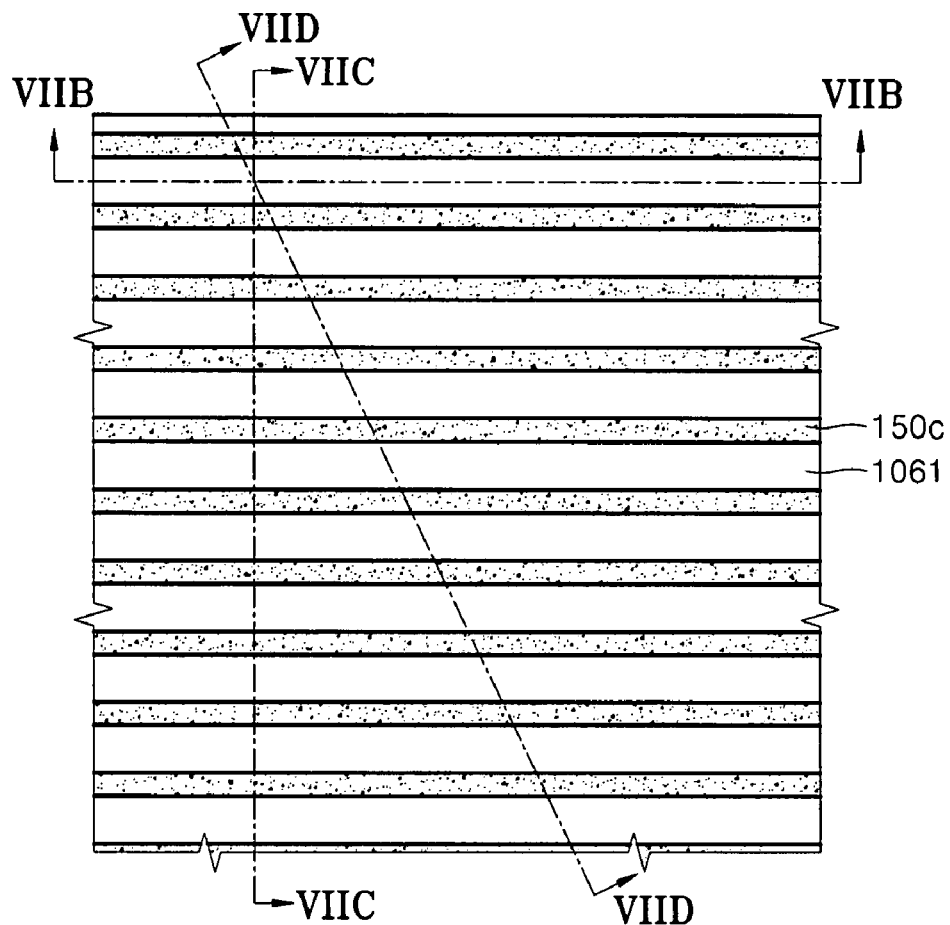
Figure 7B:
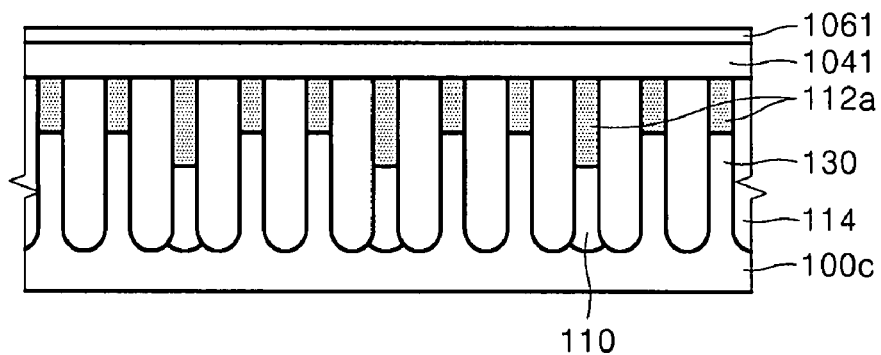
Figure 7C:
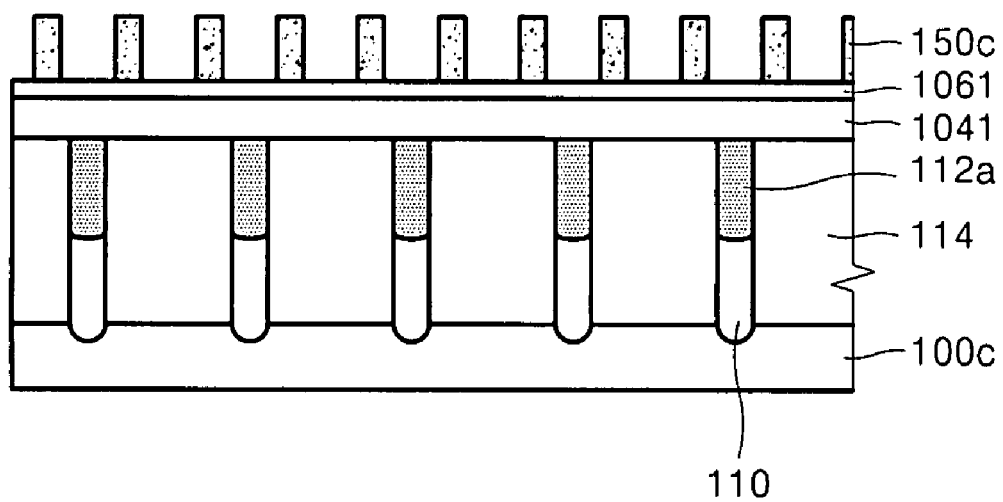
Figure 7D:
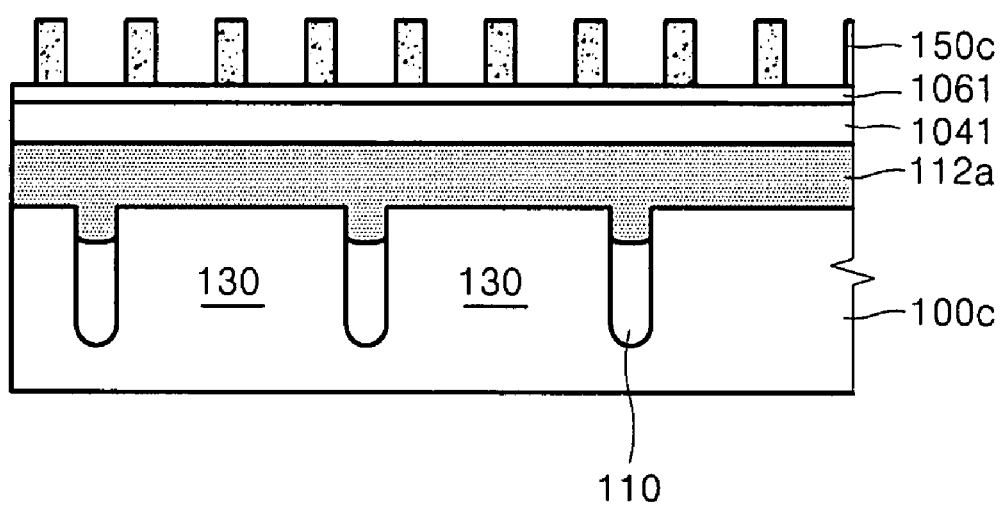

Referring to FIGS. 7A through 7D, as noted above, FIG. 7A illustrates a plan view, and FIGS. 7B through 7D are cross-section views taken along lines VIIB, VIIC and VIID, respectively.

Referring to FIGS. 7A through 7D, the second insulating layer 1041 and the anti-reflection layer 1061 may be formed to a uniform or substantially uniform thickness on the semiconductor substrate 100c. For example, the second insulating layer 1041 and the anti-reflection layer 1061 may be formed to cover the entire surface of the semiconductor substrate 100c including the active regions 130. The third resist pattern 150c may be formed on the anti-reflection layer 1061. The third resist pattern 150c may be a line pattern. The third resist pattern 150c may not pass over (e.g., may not be formed on) the upper portion of the first device isolation layer 110, but may pass over (e.g., may be formed on) the active regions 130 and the second device isolation layer 114.

Figure 8A:
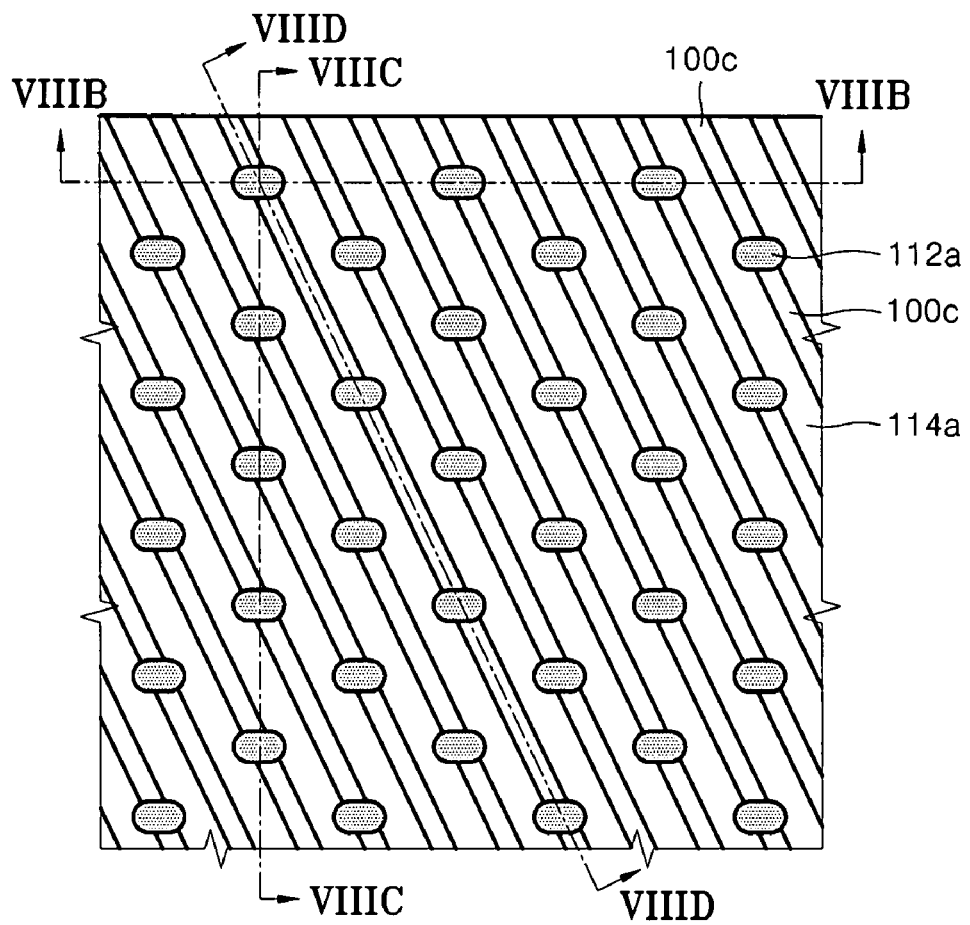
Figure 8B:
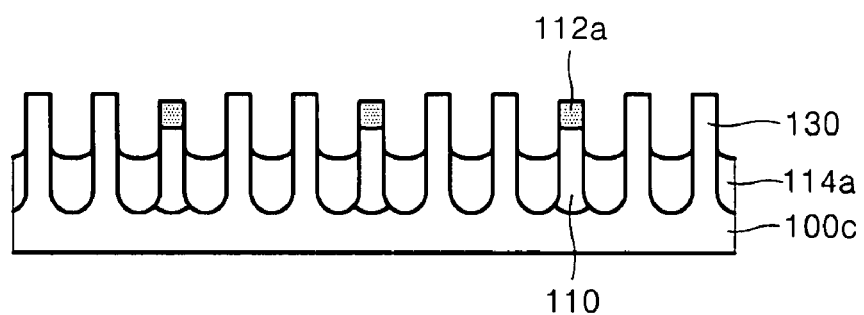
Figure 8C:
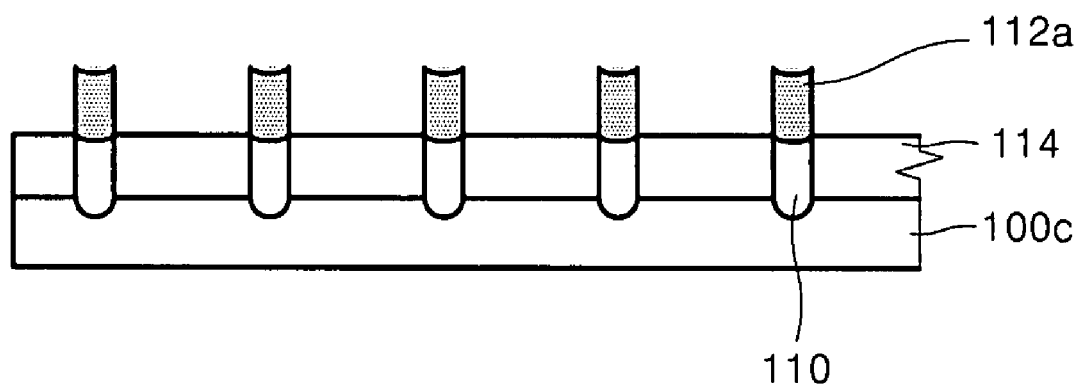
Figure 8D:
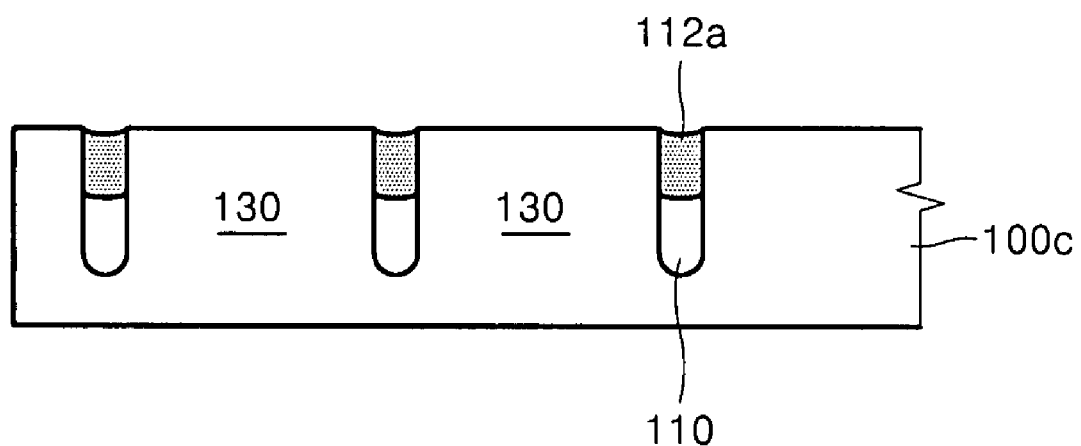

As shown in FIGS. 8A through 8D, the second device isolation layer 114 may be recessed, and part of the third insulating layer 130 may be removed. As noted above, FIG. 8A illustrates a plan view, and FIGS. 8B through 8D are cross-section views taken along lines VIIIB, VIIIC and VIIID, respectively.

Referring to FIGS. 8A through 8D, a second device isolation layer 114a may be formed. The second device isolation layer 114a may be recessed by removing a portion of the second device isolation layer 114 using the third resist pattern 150c as an etching mask. At least a portion of the third insulating layer 112a on the first device isolation layer 110 may be stripped or removed using phosphoric acid or the like to more easily connect gate electrodes. The recessed second device isolation layer 114a may be used to form gate electrodes covering sidewalls of the active regions 130.

A plurality of active regions 130 (e.g., two active regions in FIG. 8D) may be disposed in a direction of gate electrodes. The first device isolation layer 110 and the recessed second device isolation layer 114a may be repeatedly disposed in a vertical direction of the gate electrodes. The first device isolation layer 110 and the active region 130 may be alternately disposed in a long-axis direction of the active regions 130.

Figure 9A:
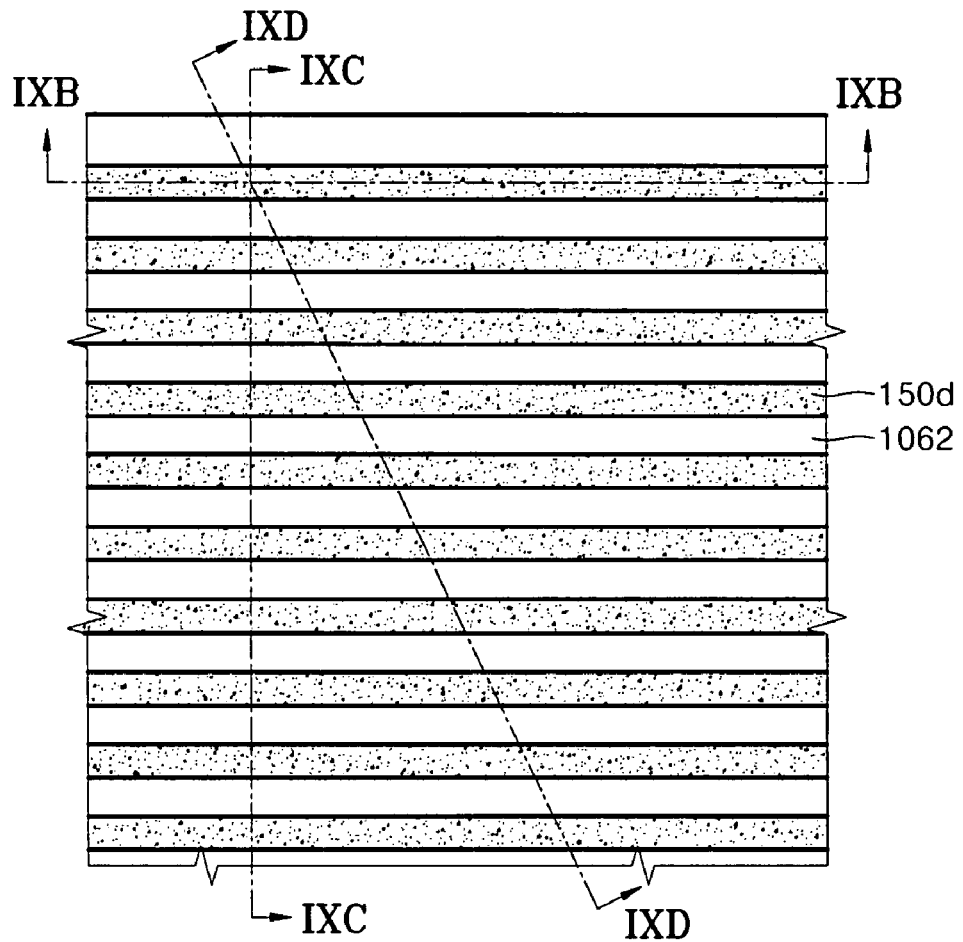
Figure 9B:
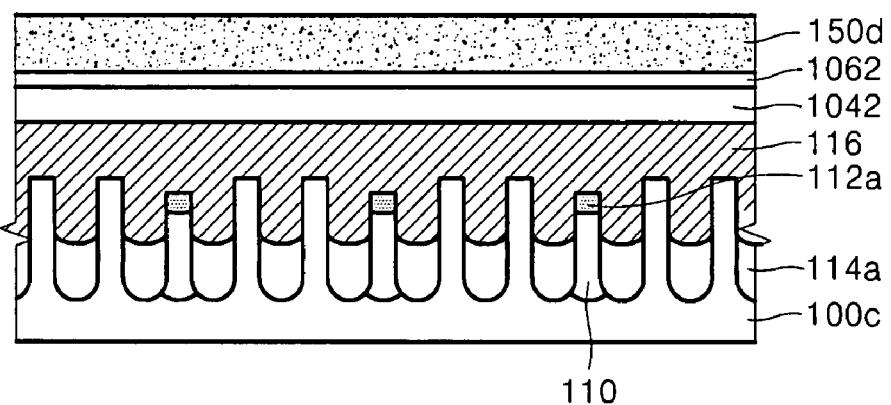
Figure 9C:
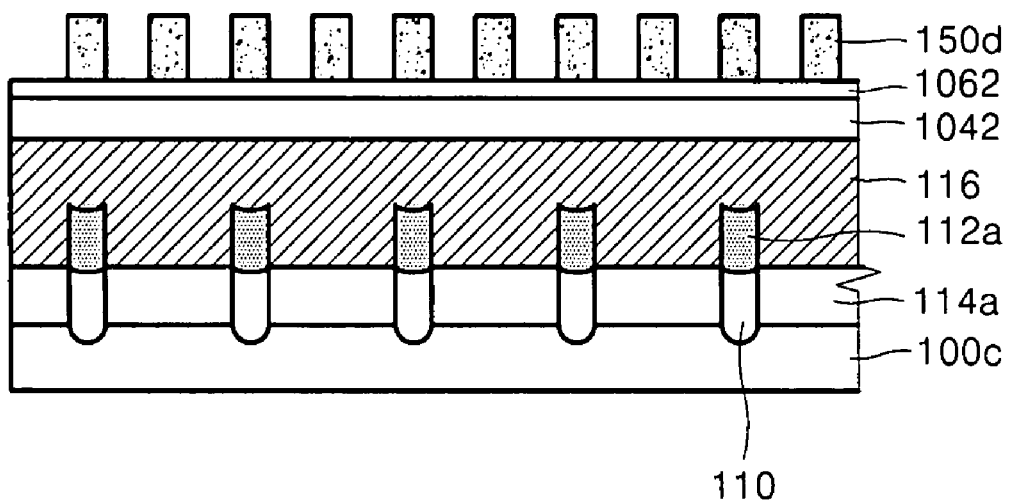
Figure 9D:
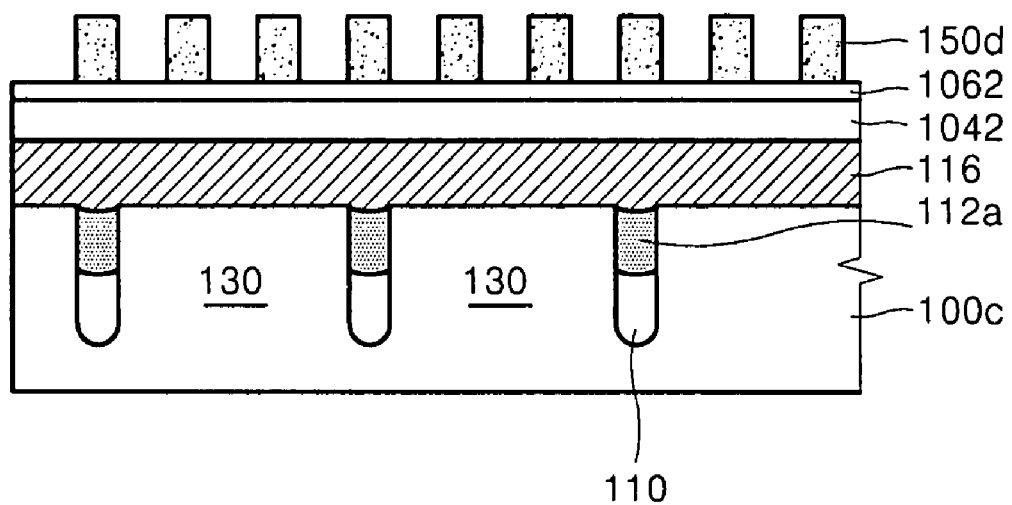
Figure 10A:
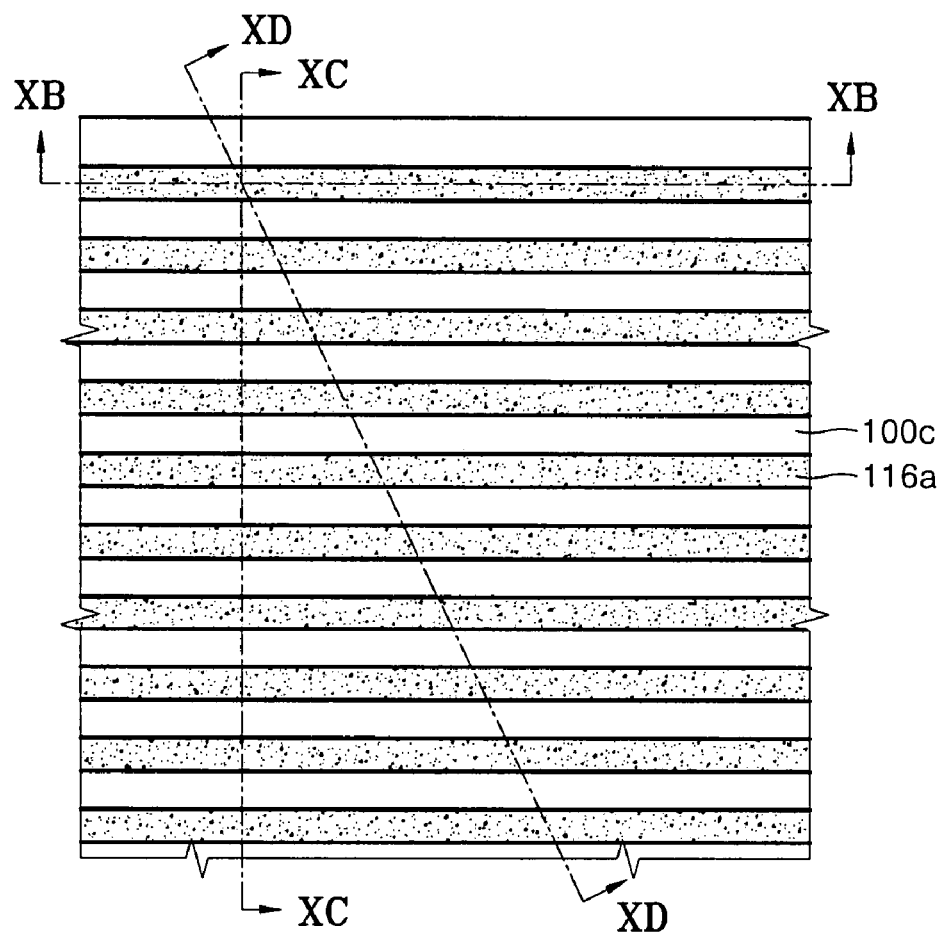

FIGS. 9A through 9D illustrate a method of forming a fourth resist pattern 150d for forming gate electrodes (116a of FIG. 10A). As noted above, FIG. 9A illustrates a plan view, and FIGS. 9B through 9D are cross-section views taken along lines IXB, IXC and IXD, respectively.

A gate insulating layer (not shown) may be formed on the semiconductor substrate 100c. For example, the gate insulating layer may be disposed on the entire surface of the semiconductor substrate 100c including the recessed second device isolation layer 114a. The gate insulating layer may coat a gate electrode material layer 116. For patterning, the second insulating layer 1042 and the anti-reflection layer 1062 may be stacked. The fourth resist pattern 150d may be formed on the anti-reflection layer 1062. The fourth resist pattern 150d may be a line-shaped pattern extending in the same or substantially the same direction as the direction of the gate electrodes of FIG. 1A.

Figure 10B:
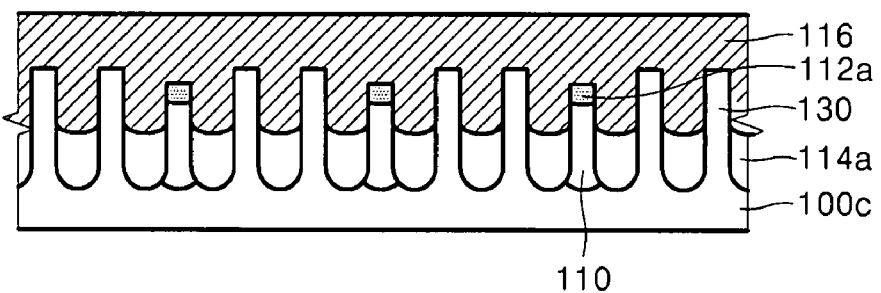
Figure 10C:
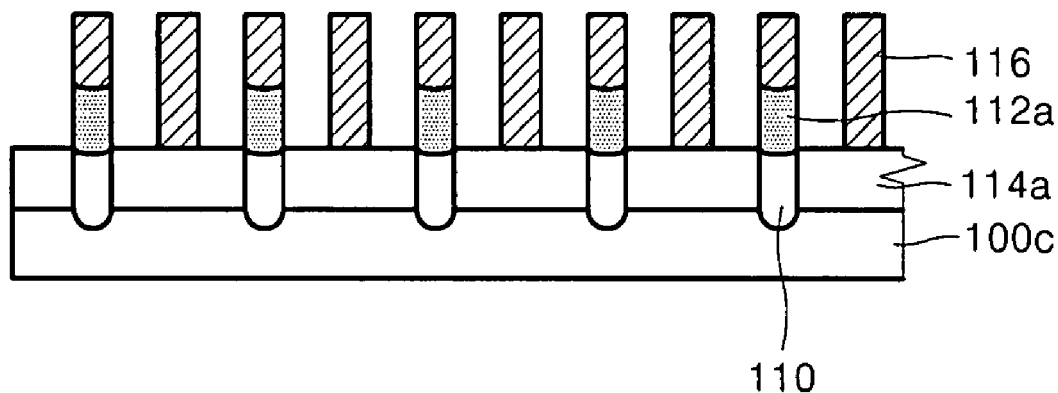
Figure 10D:
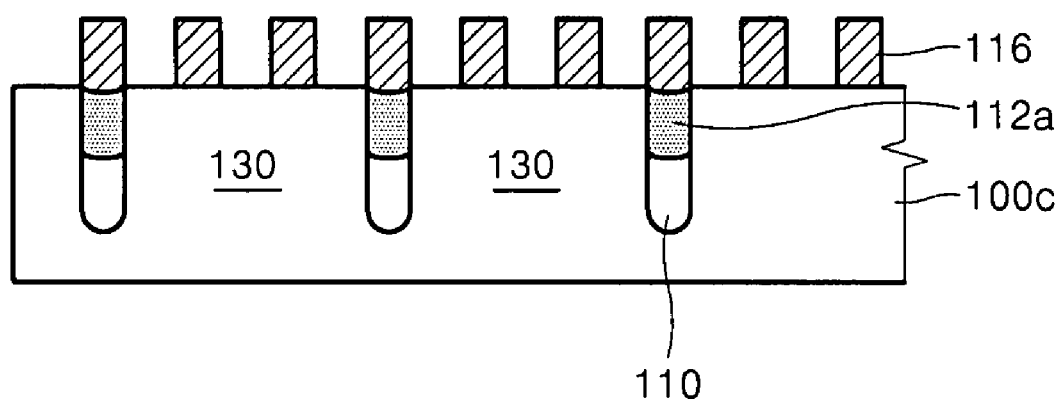

FIGS. 10A through 10D illustrate a method of forming a plurality of gate electrodes 116a. As noted above, FIG. 10A illustrates a plan view, and FIGS. 10B through 10D are cross-section views taken along lines XB, XC and XD, respectively.

Referring to FIGS. 10A through 10D, gate electrodes 116a may be formed by etching the anti-reflection layer 1062, the second insulating layer 1042, and the gate electrode material layer 116 using the fourth resist pattern 105d as an etching mask. The fourth resist pattern 150d, the anti-reflection layer 1062, and the second insulating layer 1042 may be removed. Although not shown, an insulating material may fill the space between the gate electrodes 116a so that the gate electrodes 116a may be electrically separated from one another.

According to at least some example embodiments, the anti-reflection layers 106, 1060, 1061 and/or 1062 may be comprised of the same or substantially the same material. Similarly, the second insulating layers 104, 1040, 1041 and/or 1042 may be comprised of the same or substantially the same material.

In methods of manufacturing semiconductor devices having a fin type active area and semiconductor devices according to example embodiments, a long-axis direction of active regions may be device-isolated and the active regions and device isolation may be simultaneously and/or concurrently implemented such that the active regions may be formed more easily.

While example embodiments have been particularly shown and described with reference to the example embodiments shown in the drawings, it will be understood by those skilled in the art that various changes in form and details may be made therein without departing from the spirit and scope of the present invention as defined by the following claims.

What is claimed is:

1. A method of manufacturing a semiconductor device having a fin type active area, the method comprising:
   forming island-shaped active regions by,
      forming a first insulating layer on a semiconductor substrate,
      forming a first resist pattern on the first insulating layer where the island-shaped active regions are to be formed in a first direction,
      forming grooves by etching the semiconductor substrate and first insulating layer using the first resist pattern as an etching mask, and
      forming trenches defining the island-shaped active regions in a second direction;
   forming a first device isolation layer pattern in the grooves, the first device isolation layer pattern having a shape in which the first device isolation layer pattern is separated from island-shaped active regions in the first direction; and
   forming gate electrodes insulated from one another by covering exposed sidewalls of the island-shaped active regions.

2. The method of claim 1, wherein the forming the island-shaped active regions further includes forming a second insulating layer on the first insulating layer so as to form a hard mask layer on the semiconductor substrate, the first resist pattern defining a first device isolation region on the hard mask layer,
   wherein forming the grooves includes etching the hard mask layer using the first resist pattern as an etching mask, removing the second insulating layer and the first resist pattern, and etching the semiconductor substrate using the first insulating layer,
   wherein forming the first device isolation layer pattern further includes forming a first device isolation layer on the first insulating layer and in the grooves and etching the first device isolation layer to form the first device isolation layer pattern using the first insulating layer as an etching mask.

3. The method of claim 1, wherein the forming the island-shaped active regions further includes,
   forming a hard mask layer on the semiconductor substrate, the hard mask layer including a first insulating layer and a second insulating layer, each of the first insulating layer and the second insulating layer having an etching selectivity,
   forming a contact-hole-shaped first resist pattern defining regions for forming a first device isolation pattern on the hard mask layer,
   patterning the hard mask layer to have the contact-hole shape of the first resist pattern,
   removing the first resist pattern and the second insulating layer,
   patterning the semiconductor substrate using the first insulating layer as an etching mask to form a plurality of grooves in the semiconductor substrate, and wherein forming the first device isolation layer pattern further includes,
   forming a first device isolation layer on the patterned semiconductor substrate, and
   patterning the device isolation material layer to form the first device isolation layer pattern.

4. The method of claim 1, wherein forming the trenches includes,
   forming a line-shaped second resist pattern in the first direction where the island-shaped active regions are to be formed, and
   etching the semiconductor substrate using the second resist pattern as an etching mask so as to form the trenches.

5. The method of claim 2, wherein the first resist pattern has a contact-hole shape.

6. The method of claim 2, wherein the first device isolation layer is recessed in the grooves between adjacent portions of the patterned semiconductor substrate.

7. The method of claim 2, wherein the first insulating layer and the second insulating layer each have a different etching selectivity.

8. The method of claim 6, wherein an upper surface of the recessed first device isolation layer is lower than an upper surface of the patterned semiconductor substrate.

9. The method of claim 7, wherein the first insulating layer and the second insulating layer are formed of silicon nitride and silicon oxide, respectively.

10. The method of claim 7, wherein the first insulating layer and the second insulating layer are formed of the same material.

11. The method of claim 10, wherein the first insulating layer and the second insulating layer are formed of silicon nitride or silicon oxide.

12. The method of claim 4, wherein forming the trenches further includes,
    removing the first insulating layer,
    forming a third insulating layer covering a surface of the semiconductor substrate and the first device isolation layer pattern, the third insulating layer is formed of silicon nitride,
    planarizing an upper surface of the third insulating layer,
    etching the semiconductor substrate and the third insulating layer using the second resist pattern as an etching mask so as to form the trenches.

13. The method of claim 12, wherein forming the trenches further includes,
    forming a planarized second insulating layer and an anti-reflection layer on the third insulating layer, each of the third insulating layer and the planarized second insulating layer having an unique etching selectivity,
    etching the planarized second insulating layer and the third insulating layer using the second resist pattern as an etching mask,
    removing the second resist pattern and the planarized second insulating layer, and
    etching the semiconductor substrate using the planarized third insulating layer as an etching mask so as to form the trenches.

14. The method of claim 12, wherein the forming of the gate electrodes includes,
    filling the trenches with a fourth insulating layer,
    recessing the fourth insulating layer,
    forming a gate electrode material layer covering a surface of the semiconductor substrate including the trenches,
    forming a fourth resist pattern defining the gate electrodes on the gate electrode material layer, and
    forming the gate electrodes by removing the gate electrode material layer using the fourth resist pattern as an etching mask.

15. The method of claim 14, wherein the recessing of the fourth insulating layer includes, planarizing an upper surface of the fourth insulating layer to have a height equal to a height of an upper surface of the third insulating layer, forming a hard mask layer on the planarized fourth insulating layer and the third insulating layer, forming a third resist pattern for recessing the fourth insulating layer on the hard mask layer, and removing a portion of the fourth insulating layer using the third resist pattern and the third insulating layer as an etching mask.

16. The method of claim 15, further including, removing the third insulating layer after recessing the fourth insulating layer.

\* \* \* \* \*